United States Patent [19]

Berman

[11] Patent Number: 4,816,324
[45] Date of Patent: Mar. 28, 1989

[54] FLEXIBLE PHOTOVOLTAIC DEVICE

[75] Inventor: Elliot Berman, Los Angeles, Calif.

[73] Assignee: Atlantic Richfield Company, Los Angeles, Calif.

[21] Appl. No.: 863,641

[22] Filed: May 14, 1986

[51] Int. Cl.⁴ .......................... B32B 27/00; B32B 3/02
[52] U.S. Cl. .................................... 428/216; 428/422;
428/701; 428/697; 427/85; 427/86; 427/87;
427/93; 430/84; 430/64; 437/5
[58] Field of Search ............... 428/216, 422, 701, 697;
427/85, 86, 87, 93; 430/84, 64

[56] References Cited

U.S. PATENT DOCUMENTS

| | | | |
|---|---|---|---|
| 4,104,083 | 8/1985 | Hirano | 156/99 X |
| 4,479,455 | 10/1984 | Doehler et al. | 427/85 |
| 4,510,224 | 4/1985 | Yamazaki et al. | 430/64 X |
| 4,543,294 | 9/1985 | Sakagami et al. | 428/422 |
| 4,551,352 | 11/1985 | Pankove | 427/85 |
| 4,585,689 | 4/1986 | Ohta et al. | 428/697 |
| 4,615,943 | 10/1986 | Sakagami et al. | 428/422 |

*Primary Examiner*—P. C. Ives
*Attorney, Agent, or Firm*—Nilsson, Robbins, Dalgarn, Berliner, Carson & Wurst

[57] ABSTRACT

A photovoltaic device of improved flexibility is provided by using a tetrafluoroethylene-perfluoroalkoxy resin substrate.

9 Claims, 1 Drawing Sheet

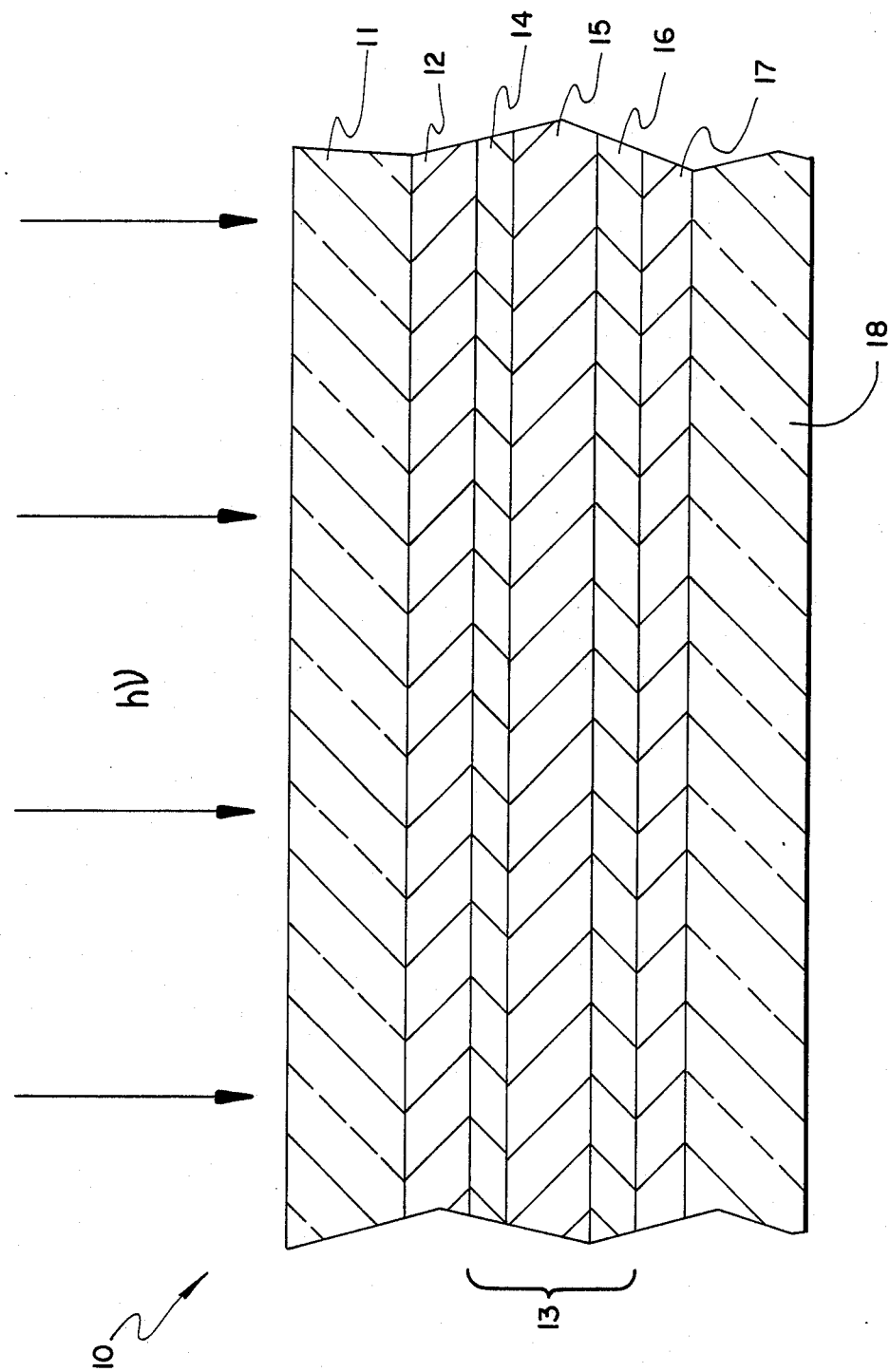

FLEXIBLE PHOTOVOLTAIC DEVICE

BACKGROUND OF THE INVENTION

The present invention relates generally to the art of photovoltaic devices, such as solar cells for converting light into electrical energy, and, more particularly, to a flexible photovoltaic device.

Photovoltaic devices generally consist of an active photovoltaic material capable of generating an electrical potential upon being exposed to light, contacts, which are effective to draw off any electric current which results from irradiation of the active photovoltaic material, and a suitable substrate. In most instances, such photovoltaic devices are relatively rigid, either because the active photovoltaic material itself is rigid or because the substrate or other component of the device is inflexible. Glass, which is relatively inflexible, has found frequent use as substrate in photovoltaic devices because of its strength, durability, tolerance to high processing temperatures and desirable optical properties. Attempts to provide flexible photovoltaic devices have been documented. A flexible rolled up solar array, for example, has been described in "The Flight of the FRUSA" by George Wolff and Alois Wittmann, Conf. Rec., Ninth IEEE Photovoltaic Specialists Conf., May 2-4, 1972, page 240-253, reprinted in *Solar Cells*, edited by Charles E. Backus, The Institute of Electrical and Electronics Engineers, Inc., New York, 1976, pp. 342-355.

Many different photoconductive materials, such as silicon, germanium, gallium arsenide and copper indium diselenide, for example, are used in solar cells and similar photovoltaic devices. Photoconductors comprising silicon have obtained particularly wide usage because of their economy. Originally, single crystal silicon photoconductors were widely used. However, recently, thin film Si:H alloys (TFS) have been used in thin film solar cells, that is, solar cells fabricated from microcrystalline, amorphous compound semiconductors or semiconductor material other than single crystalline semiconductor material, deposited in situ upon a substrate. Such thin film solar cells have come to be preferred because of their lower cost, ease of fabrication, and durability.

For example, active photovoltaic materials incorporating a P-layer, an I-layer and an N-layer, known as P-I-N photovoltaic materials, have been utilized. The I-layer, the intrinsic layer, is generally formed from a thin layer of microcrystalline or amorphous silicon alloyed with hydrogen. The P-layer is formed from a silicon-hydrogen alloy doped with boron or similar dopant. The N-layer is formed from a silicon-hydrogen alloy doped with phosphorous or similar dopant.

Various types of conductive layers or contacts have been used in photovoltaic devices. Contacts on the P-layer and the N-layer, for example, permit electric current to be drawn off into an external circuit for use therein. Such contacts usually have taken the form of thin films. In addition, transparent conductive layers, such as tin oxide, indium tin oxide, or other transparent conductive oxides have found application in solar cells and other photovoltaic devices. The use of zinc oxide films as transparent conductive layers, for example, is disclosed in U.S. Pat. No. 4,623,601 issued Nov. 18, 1986 to Steven C. Lewis et al, assigned to the same assignee as the present invention. Such conductive oxides are relatively transparent in reasonable thicknesses and have been used primarily as the front contact in solar cells, that is, the contact adjacent to the transparent substrate, which may face or be distant from the incoming light rays. They have also been used as back contacts in solar cells where transparency is a major consideration, for example, in tandem cells or bifacial cells.

The utilization of thin film photoconductors and thin conductive layers has made available solar cells which are thinner and lighter in weight than previously available solar cells. However, presently available thin film solar cells have only limited flexibility, due primarily to the use of glass as a substrate. Rather than providing a truly flexible solar cell, the prior art has approached the problem by providing a rolled up array of inflexible solar cells upon a flexible backing, as in the FRUSA system.

It is accordingly an object of the present invention to provide a flexible photovoltaic device.

It is another object of this invention to provide such flexible photovoltaic device which can be manufactured in a continuous process.

Another object of this invention is to provide a flexible photovoltaic device having good optical properties.

Other objectives and advantages of the present invention will become apparent from the following detailed description.

SUMMARY OF THE INVENTION

The flexible photovoltaic device of the present invention utilizes, as a transparent, flexible substrate, a tetrafluoroethylene-perfluoroalkoxy resin. The substrate is stable under the relatively high temperature processing conditions encountered in the fabrication of solar cells and is transparent to light falling upon the solar cell. Thin film solar cells incorporating such copolymeric transparent substrate can be used, therefore, in environments where flexibility is a desideratum, such as in space vehicles and other space applications.

BRIEF DESCRIPTION OF THE DRAWINGS

The sole FIGURE of the drawings is an enlarged, fragmentary, cross-sectional schematic view of a flexible solar cell according to the present invention.

DESCRIPTION OF THE PREFERRED EMBODIMENTS

In general, the present invention relates to flexible photovoltaic devices in which a tetrafluoroethylene-perfluroalkoxy resin in the form of a film is used as a substrate. The perfluoroalkoxy moiety of the copolymer, which is derived from perfluorinated alkoxy olefins, has the formula:

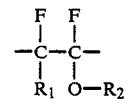

wherein $R_1$ is F or perfluoroalkyl, $R_2$ is perfluoroalkyl and, where $R_1$ is perfluoroalkyl, $R_1$ and $R_2$ may be the same or different perfluoroalkyl radicals. Films of this type are available commercially as TEFLON PFA fluorocarbon film from E. I. duPont de Nemours & Co., Wilmington, Del. The fluorocarbon films used in the flexible solar cell of the present invention have crystalline melting points greater than about 300 degrees Celsius and therefore can be used in the fabrication of solar cells requiring temperatures in the range of up to about 200 degrees to 250 degrees Celsius during manufacture. Solar cells fabricated from such films and utilizing thin film photoconductors, thin film conductive layers and a flexible polymeric backing can be produced in a continuous process.

The fluorocarbon films used in the present invention are stable to light and oxygen and therefore are especially adaptable to outdoor use. They have a refractive index of about 1.35 and are less reflective than glass, which has a refractive index of about 1.5. Whereas the use of glass as a substrate for solar cells requires batch processing, the fluorocarbon copolymers used as substrates herein facilitate the fabrication of solar cells in the form of a continuous web. Deposition of conductive layers can be readily accomplished by sputtering, by means of chemical vapor deposition or by means of plasma deposition.

Turning now to the drawing FIGURE, the photovoltaic device of the present invention is exemplified by a solar cell 10 which consists of a substrate 11, a transparent conductive layer 12 and a series of layers comprising a TFS layer 13. The TFS layer 13 consists of a P-layer 14, an I-layer 15 and an N-layer 16. Adjacent to N-layer 16 is a second cnductive layer 17. Adjacent to conductive layer 17 is a backing 18.

The substrate 11 is the tetrafluoroethylene-perfluoroalkoxy resin described above. It can be about 0.1 mil to 5 mils in thickness.

The transparent conductive layer 12 can be any conductive oxide, for example, zinc oxide, tin oxide or indium tin oxide and can be about 100-60,000 angstroms in thickness. In a preferred embodiment, the transparent conductive layer is zinc oxide.

The active photovoltaic material 13 is shown as comprising 3 layers of semiconductive materials, namely, a P-layer, an I-layer and an N-layer. However, if desired, it is sufficient to provide a P-layer and an N-layer, or to use a single layer in which a concentration gradient of dopant results in contributing P-character and N-character to various parts of the layer.

In a preferred embodiment, P-layer 14 comprises a hydrogenated silicon-carbon alloy which is doped with boron. In this preferred embodiment, the P-layer can contain about 60-70 atomic percent of silicon, about 20 atomic percent carbon, about 10-20 atomic percent hydrogen, and a fraction of a percentage of boron as a dopant. The thickness of the P-layer can vary between about 70 and 300 angstroms.

I-layer 15 is composed of a silicon-hydrogen alloy which can contain about 85-95 atomic percent silicon and about 5-15 atomic percent hydrogen. The I-layer can be about 2500-7500 angstroms in thickness.

N-layer 16 is composed of amorphous silicon containing phosphorous. This layer can contain about 85-95 atomic percent silicon, about 5-15 atomic percent hydrogen and a fraction of a percent to a few percent phosphorous. The thickness of the N-layer can be between about 200 and 800 angstroms.

The back contact 17 is a second conductive layer. In a preferred embodiment, the conductive layer 17 is zinc oxide containing certain additives. Such additives as hydrogen or a group III element, such as boron, aluminum, gallium, indium or thallium, can be used depending upon the resistivity and thermal properties desired. For example, zinc oxide containing hydrogen is less thermally stable than is zinc oxide containing aluminum, while zinc oxide containing aluminum has a somewhat higher resistivity than does zinc oxide containing hydrogen. Trace amounts of the additives are used, as will be pointed out more in detail below.

Backing 18 can be any transparent plastic material which is reasonably resistant to oxygen and light. Polyesters can be used, as can various fluorocarbons. For example, polytetrafluoroethylene, available as TEFLON FEP from E. I. duPont de Nemours & Co., having a melting point in the range of about 150 to 200 degrees Celsius can be used. Polyvinylfluoride, available as TEDLAR from E. I. duPont de Nemours & Co., is also satisfactory although it has a melting point of about 150 degrees Celsius. The tetrafluoroethylene-perfluoroalkoxy resin used as the substrate can likewise be used as the backing, since this material will not block.

In fabricating the photovoltaic devices of this invention, the transparent conductive layer can be deposited upon the substrate by means of a glow discharge technique, sputtering, or chemical vapor deposition. For example, a 100-60,000 angstrom layer of zinc oxide can be applied to the fluorocarbon copolymer by means of magnetron sputtering at low temperatures, i.e., temperatures in the range of about 25-250 degrees Celsius.

Following deposition of the transparent conductive layer, the active photovoltaic material is deposited in several steps. The P-layer can be readily formed by introducing a mixture of silane, methane and diborane into a glow discharge chamber in proportions to give the desired P-layer composition. Deposition upon the transparent conductive layer occurs at a pressure of about 0.1-1.0 torr and at a temperature of about 150-250 degrees Celsius. Deposition is continued for a sufficient period of time to deposit a layer of the desired thickness. A P-layer having a band-gap between about 1.9 and 2.0 eV, a dark conductivity of about $10^{-6}$ inverse ohm-centimeter and a light conductivity of about $10^{-5}$ inverse ohm-centimeter can be obtained in this manner.

Deposition of the I-layer is accomplished by filling the chamber with pure silane gas. Deposition then proceeds at a pressure of about 0.1-1.0 torr and a temperature of about 150-250 degrees Celsius. Following deposition of the I-layer, the N-layer is deposited from silane and a mixture of phosphine in an inert gas passed through the chamber at a pressure of about 0.1-1.0 torr and a temperature of about 150-250 degrees Celsius.

The next step in the fabrication is the deposition of the second conductive layer which serves as a back contact layer.

In a preferred embodiment the second conductive layer is a wide band-gap zinc oxide layer which is transparent at wavelengths in the visible range from 300 to 1300 nm. Zinc oxide can be readily deposited by sputtering to provide a transparent layer having a thickness in the range of about 100-60,000 angstroms at a pressure in the range of about 5 to 20 millitorr and at a temperature in the range of about 25-250 degrees Celsius with about 2,000-15,000 angstroms being preferred. Where hydrogen inclusion is desired, the hydrogen pressure should be in the range of about 0.01 to 0.08 millitorr with 0.04 millitorr preferred. Where aluminum inclusion is desired, the aluminum content should be in the range of about 0.2-10 percent by weight with about 0.5-5 weight percent preferred. The resulting conductive layer is highly conductive, having a resistivity in the range of about $10^{-4}$ to $10^{-2}$ ohm-centimeter. Where the zinc oxide contains hydrogen, the resulting ZnO:H layer, which can be deposited at a temperature of about 25 to 90 degrees Celsius, has been found to have a resistivity in the range of about $6 \times 10^{-4}$ to $1 \times 10^{-3}$ ohm-centimeter. A zinc oxide layer containing aluminum can be deposited at somewhat higher temperatures as well as at romm temperature depending upon the method used. The ZnO:Al layer has a resistivity of about $8 \times 10^{-4}$ to $1 \times 10^{-3}$ ohm-centimeter. It is also possible to include both hydrogen and aluminum in the zinc oxide. Hydrogen pressures in the range of about 0.01 to 0.08 millitorr and an aluminum content in the range of about 0.20 to 10 weight percent are suitable. A hydrogen pressure of about 0.04 millitorr and an aluminum content of about 0.5 to 5 weight percent are preferred. The ZnO:H:Al layer displays a resistivity in the range of about $3 \times 10^{-4}$ to $6 \times 10^{-4}$ ohm-centimeter. Alternatively, the zinc oxide layer can be applied by chemical vapor deposition as described in the copending application of Pantham I. Vijayakumar et al., Ser. No. 24,871, filed Mar. 12, 1987, which is a continuation of Ser. No. 741,081, filed June 4, 1985, now abandoned, assigned to the same assignee as the present invention.

Where the back contact can be metallic, it can be applied by electroless plating of nickel or other metal on the N-layer of the active photovoltaic material. Such electroless plating is readily accomplished by using an electroless plating solution maintained at a slightly alkaline pH and moderately heating the plating bath while immersing the partially fabricated solar cell into the bath. Immersion for a period of time within the range of about 1-10 minutes is generally sufficient to provide a nickel layer of the desired thickness upon the n+Si:H alloy comprising the N-layer of the active photovoltaic material without depositing nickel upon the substrate. A pH in the range of about pH 7.5-8.5 is satisfactory, the pH being maintained by the addition of ammonium hydroxide to the plating bath. Temperatures in the range of about 80 degrees to 95 degrees Celsius and preferably about 90 degrees Celsius are effective to produce the desired deposition of nickel. If desired, the electroless plating solution can be applied by spraying rather than immersing. The electroless plating is further described in my copending application Ser. No. 838,737, filed Mar. 11, 1986, assigned to the same assignee as this invention.

The final step in the fabrication of the photoconductive device of the present invention is the application of the backing. As pointed out above, various polymeric materials can be used for the backing. A convenient method of application is to deposit powdered polymer upon the surface of the semi-finished solar cell by centrifugal sedimentation or by use of a slurry process followed by fusing, to produce the film in the desired thickness. It is also possible to utilize an appropriate adhesive; however, the adhesive must be one which has optical properties which will not adversely affect the transparency of the photoconductive device. Other methods of applying the backing may also be used if desired.

The photovoltaic device of this invention is particularly useful in space applications for a number of reasons in addition to its flexibility. First, the Si:H alloys used as active photovoltaic materials display excellent radiation resistance. Second, the present photovoltaic device can be used in a bifacial mode, that is, it can be irradiated from either or both sides, making it possible to operate at 2 suns radiation rather than 1 sun.

While certain specific embodiments of the invention have been disclosed as typical, the invention is, of course, not limited to these particular forms, but rather is applicable to all such variations that fall within the scope of the appended claims. For example, various other types of photovoltaic devices than solar cells can be fabricated in accordance with the present invention.

What is claimed is:

1. A photovoltaic device comprising a transparent substrate, a transparent conductive layer adjacent to said transparent substrate, a TFS layer adjacent to said transparent conductive layer, and a conductive layer adjacent to said TFS layer, said transparent substrate being a tetrafluoroethyleneperfluoroalkoxy resin in the form of a flexible film, the perfluoroalkoxy moiety of the resin having the formula:

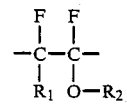

wherein $R_1$ is F or perfluoroalkyl and $R_2$ is perfluoroalkyl and, where $R_1$ is perfluoroalkyl, $R_1$ and $R_2$ may be the same or different perfluoroalkyl radicals, said film having a melting point above about 300° C.

2. A photovoltaic device according to claim 1 wherein said transparent substrate has a thickness in the range of about 0.1 mil to 5 mils.

3. A photovoltaic device according to claim 1 which also contains a transparent backing on the surface opposite from said transparent substrate.

4. A photovoltaic device according to claim 3 wherein said transparent backing is polyvinyl fluoride.

5. A photovoltaic device according to claim 3 wherein said transparent backing has a thickness in the range of about 0.1 mil to 5 mils.

6. A photovoltaic device according to claim 3 wherein said transparent backing is comprised of the same material as said transparent substrate.

7. A photovoltaic device according to claim 1 wherein said TFS layer comprises PIN type photovoltaic material.

8. A photovoltaic device according to claim 1 wherein said transparent conductive layer is a member selected from the group consisting of zinc oxide, tin oxide and indium tin oxide.

9. A photovoltaic device according to claim 1 wherein said transparent conductive layer has a thickness of about 100 angstroms to 60,000 angstroms.

* * * * *